(12) United States Patent
Kao et al.

(10) Patent No.: US 6,429,696 B1
(45) Date of Patent: Aug. 6, 2002

(54) PEAK HOLD AND CALIBRATION CIRCUIT

(76) Inventors: Cheng-Yung Kao, No.38, Ln.76, Kuang Ming Rd. Chutung Town, Chutung Town, Hsinchu; Wen-Tsao Chen, 6F, No.19-10, Aly.6, Ln.14, Niu Pu Rd., HsiangShan District, Hsinchu; Yung-Pin Lee, 4F, No.35, Ln.70, Sec.3, Hsiu Lang Rd., ChungHo Taipei, all of (TW)

( * ) Notice: Subject to any disclaimer, the term of this patent is extended or adjusted under 35 U.S.C. 154(b) by 0 days.

(21) Appl. No.: 09/500,098

(22) Filed: Feb. 8, 2000

(51) Int. Cl.$^7$ .................. G01R 19/00; H03K 5/153
(52) U.S. Cl. .............................. 327/58; 327/62
(58) Field of Search ............... 327/52, 56, 58–60, 327/72–77, 81, 89, 91, 93–96, 560–563

(56) References Cited

U.S. PATENT DOCUMENTS

| | | | |
|---|---|---|---|
| 5,025,176 A | * 6/1991 | Takeno | 327/94 |
| 5,315,168 A | * 5/1994 | Norton, Jr. | 327/94 |
| 5,841,383 A | * 11/1998 | Regier | 341/122 |
| 6,177,814 B1 | * 1/2001 | Taguchi | 327/58 |

* cited by examiner

Primary Examiner—My-Trang Nu Ton (57) ABSTRACT

The present invention generally relates to a peak hold and calibration circuit, and more particularly, to a peak hold and calibration circuit for use in measuring the signals in a digital multi-meter implemented by using an integrated circuit (IC) and a capacitor, wherein said IC is connected to said capacitor; wherein said IC comprises an operational amplifier, and a switching circuit; wherein a first voltage is applied to one input terminal of said operational amplifier and the other input terminal of said operational amplifier is connected to the feedback network while the output terminal of said operational amplifier is connected to said switching circuit; wherein the output of said switching circuit is a second voltage and connected to said capacitor. The peak hold and calibration circuit for use in measuring the signals in a digital multi-meter of the present utilizes only a few components, thus it has lower fabricating cost, higher economic profit, low power-consumption and can solve the problems in that the diode which has short switching time, small parasitic capacitance, and small leakage current is hardly found.

38 Claims, 6 Drawing Sheets

PEAK HOLD AND CALIBRATION CIRCUIT

FIELD OF THE INVENTION

The present invention generally relates to a peak hold and calibration circuit, and more particularly, to a peak hold and calibration circuit for use in measuring the signals in a digital multi-meter implemented by using very large scale integration (VLSI) technology.

BACKGROUND OF THE INVENTION

In a general electronic circuit system, a peak hold circuit that uses a peak maximum circuit and a peak minimum circuit is used to measure the maximum voltage value and the minimum voltage value of an analog input signal.

Figure 1:
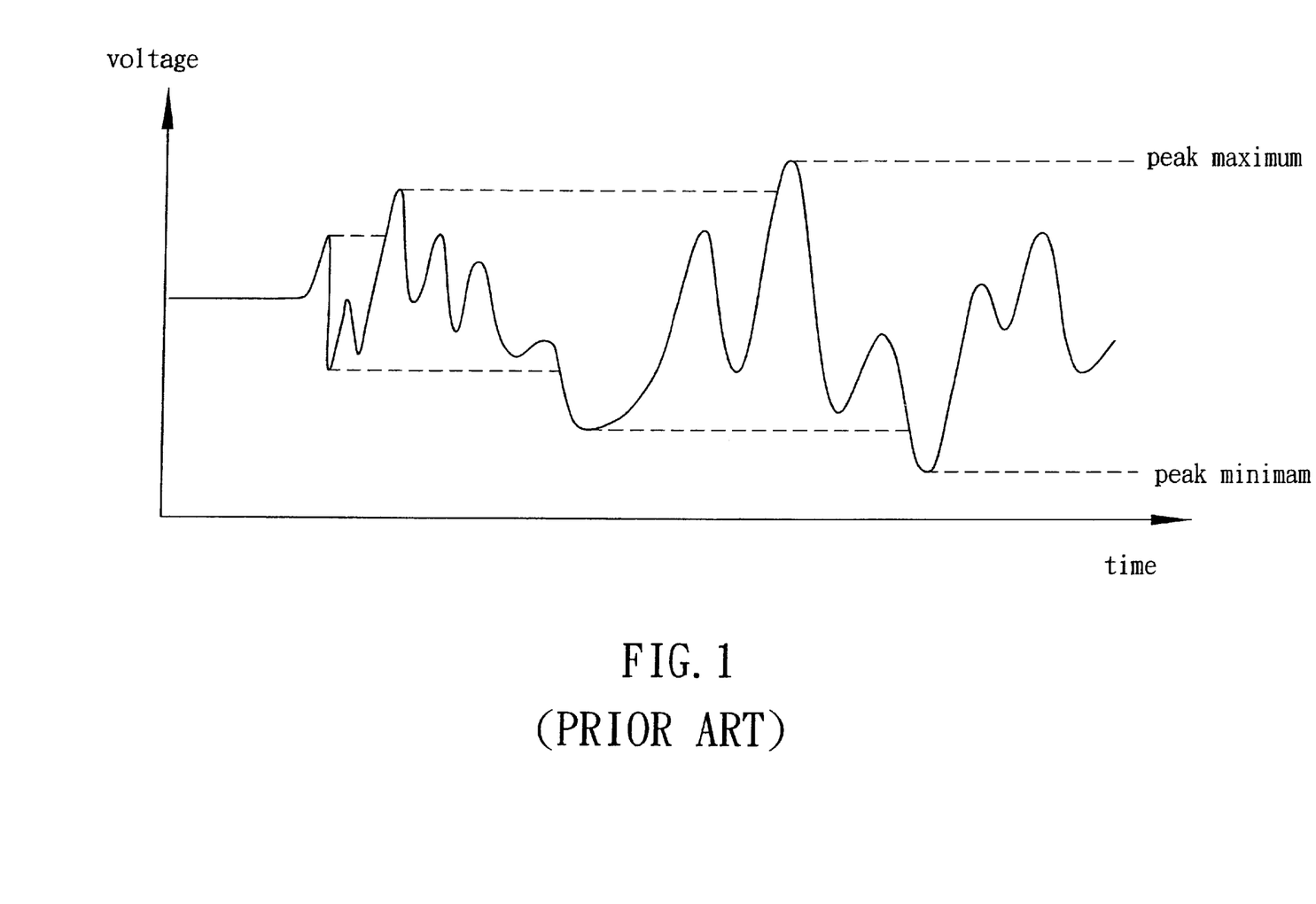
FIG. 1 illustrates the definitions of a maximum voltage value and a minimum voltage value of an analog input signal.

Please refer to FIG. 1, which illustrates the definitions of a maximum voltage value and a minimum voltage value of an analog input signal. The currently used peak hold circuit that is applied to measure the maximum voltage value and the minimum voltage value of an analog input signal in a digital multi-meter is implemented by using discrete components.

Figure 2A:
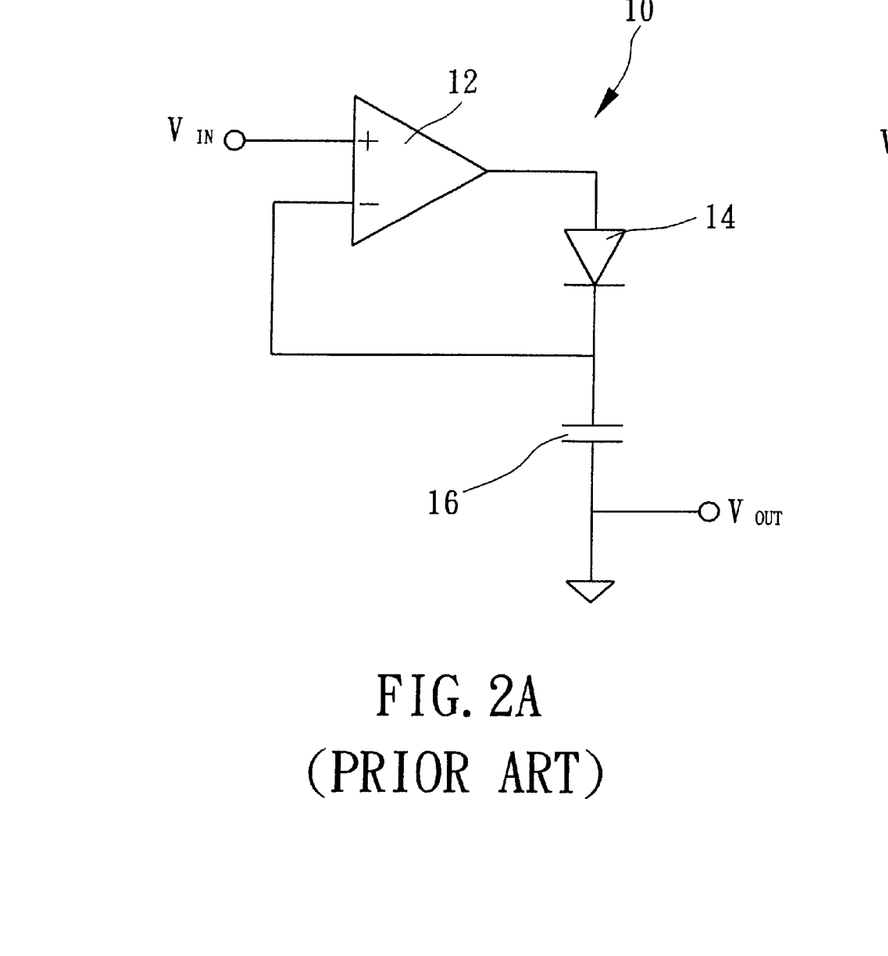
FIG. 2A is a detailed circuit that illustrates the peak maximum circuit of the conventional peak hold circuit of the prior art.
Figure 2B:
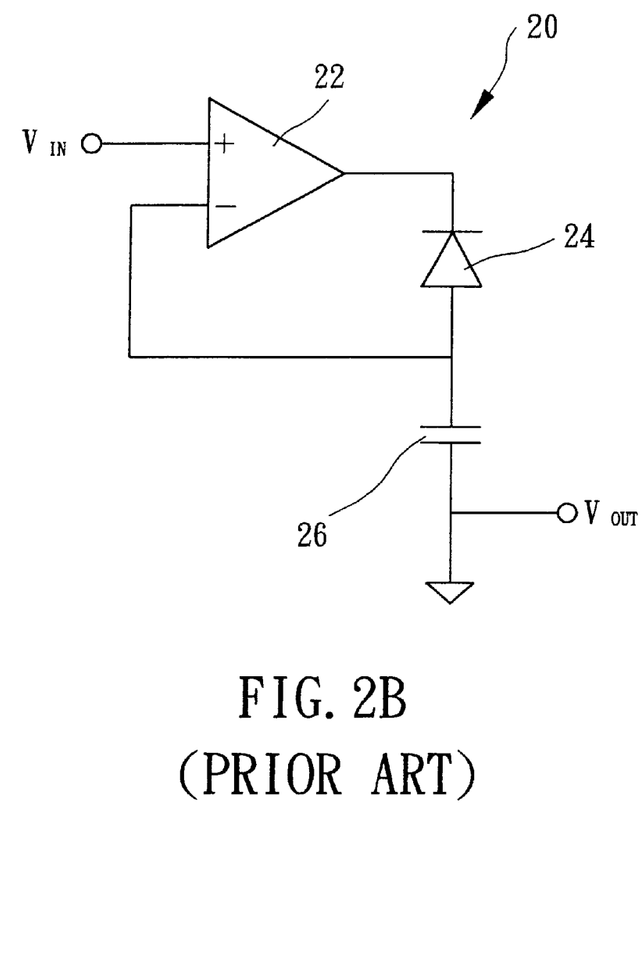
FIG. 2B is a detailed circuit that illustrates the peak minimum circuit of the conventional peak hold circuit of the prior art.

Please refer to FIG. 2A and FIG. 2B, which are two detailed circuits that illustrate the peak maximum circuit and the peak minimum circuit of the conventional peak hold circuit of the prior art. To be more specific, FIG. 2A is a peak maximum circuit 10, and FIG. 2B is a peak minimum circuit 20.

As can be seen in FIG. 2A, the peak maximum circuit 10 comprises an operational amplifier 12, a diode 14, and a capacitor 16. The input signal $V_{IN}$ is applied directly to the non-inverting input terminal of the operational amplifier 12 while the output terminal of the operational amplifier 12 is connected to the positive terminal of the diode 14 that is further connected to the inverting input terminal of the operational amplifier 12 and the capacitor 16.

When the input voltage $V_{IN}$ is higher than the output voltage $V_{OUT}$, the logic state of the output of the operational amplifier 12 is "high". In the meantime, the diode 14 is turned on and the output voltage $V_{OUT}$ follows the input voltage $V_{IN}$. In this case, the output voltage $V_{OUT}$ equals to the input voltage $V_{IN}$.

On the contrary, when the input voltage $V_{IN}$ is lower than the output voltage $V_{OUT}$, the logic state of the output of the operational amplifier 12 is "low". In the meantime, the diode 14 is off and the capacitor 16 maintains the voltage of the output voltage $V_{OUT}$. Once the input voltage $V_{IN}$ increases to be higher than the output voltage $V_{OUT}$, the output voltage $V_{OUT}$ follows the input voltage $V_{IN}$ again.

Moreover, as shown in FIG. 2B, the peak minimum circuit 20 comprises an operational amplifier 22, a diode 24, and a capacitor 26. The input signal $V_{IN}$ is applied directly to the non-inverting input terminal of the operational amplifier 22 while the output terminal of the operational amplifier 22 is connected to the negative terminal of the diode 24 that is further connected to the inverting input terminal of the operational amplifier 22 and the capacitor 26.

When the input voltage $V_{IN}$ is lower than the output voltage $V_{OUT}$, the logic state of the output of the operational amplifier 22 is "low". In the meantime, the diode 24 is turned on and the output voltage $V_{OUT}$ follows the input voltage $V_{IN}$. In this case, the output voltage $V_{OUT}$ equals to the input voltage $V_{IN}$.

On the contrary, when the input voltage $V_{IN}$ is higher than the output voltage $V_{OUT}$, the logic state of the output of the operational amplifier 22 is "high". In the meantime, the diode 24 is off and the capacitor 26 maintains the voltage of the output voltage $V_{OUT}$. Once the input voltage $V_{IN}$ decreases to be lower than the output voltage $V_{OUT}$, the output voltage $V_{OUT}$ follows the input voltage $V_{IN}$ again.

However, the conventional peak hold circuit demands critical characteristics of the diode, therefore the diode needs to have short switching time, small parasitic capacitance, and small leakage current. Such a diode is hardly found. In addition, the capacitor that matches such a diode well is generally a holding capacitor that has a greater capacitance. Therefore, the peak hold signal is slow speed and the system is high power-consuming.

Accordingly, the conventional peak hold circuit implemented by using discrete components and composed of an operational amplifier, a diode, and a capacitor has several problems in that the peak hold circuit has higher fabricating cost, less economic profit and higher power consumption. Also the diode which has short switching time, small parasitic capacitance, and small leakage current is hardly found.

BRIEF DESCRIPTION OF THE INVENTION

In order to overcome the problems that have been previously discussed above, the present invention has been proposed and relates to a peak hold and calibration circuit for use in measuring the signals in a digital multi-meter so as to solve the problems that occur in the conventional digital multi-meter of the prior art.

Accordingly, it is the main object of the present invention to provide a peak hold circuit for use in measuring the signals in a digital multi-meter so as to solve the problem in that the peak hold circuit implemented by using discrete components has higher fabricating cost, less economic profits and higher power consumption. Also diode which has short switching time, small parasitic capacitance, and small leakage current is hardly found.

In order to accomplish the foregoing objects, the present invention provides a peak hold circuit for use in measuring the signals in a digital multi-meter, which can be implemented by using an integrated circuit (to be abbreviated as "IC" here below) and a capacitor, wherein said IC is connected to said capacitor; wherein said IC comprises an operational amplifier, and a switching circuit; wherein a first voltage is applied to one input terminal of said operational amplifier and the other input terminal of said operational amplifier is connected to the feedback network while the output terminal of said operational amplifier is connected to said switching circuit; wherein the output of said switching circuit is a second voltage and connected to said capacitor. The peak hold and calibration circuit for use in measuring the signals in a digital multi-meter of the present utilizes only a few components; thus it has lower fabricating cost, higher economic profit and lower power consumption. Also this invention doesn't need to the diode which has short switching time, small parasitic capacitance, and small leakage current.

It is preferable that said switching circuit comprises a transistor, which can provide a current that is large enough to charge said capacitor.

It is preferable that said peak hold circuit for use in measuring the signals in a digital multi-meter comprises a resistor, which is connected to said transistor so as to prevent said second voltage from overshooting.

It is preferable that said transistor is an n-channel field effect transistor (to be abbreviated as "FET" here below); said first voltage is applied to the non-inverting input terminal of said operational amplifier; the inverting input terminal of said operational amplifier is connected to the feedback network; the output terminal of said operational amplifier is connected to the gate of said n-channel FET.

It is preferable that the drain of said n-channel FET is connected to the highest voltage terminal of the circuit and the source is connected to said resistor; the other terminal of said resistor is connected to said capacitor; and a low noise direct current (DC) voltage of the circuit is applied to the other terminal of said capacitor.

It is preferable that before the measurement, said second voltage is set to be lower than the lowest voltage in the effective measuring range.

It is preferable that when said first voltage is higher than said second voltage, the logic state of the output of said operational amplifier is "high". In the meantime, said n-channel FET is turned on and said second voltage follows said first voltage.

It is preferable that when said first voltage is lower than said second voltage, the logic state of the output of said operational amplifier is "low". In the meantime, said n-channel FET is off and said capacitor maintains the voltage of said second voltage.

It is preferable that once said first voltage increases to be higher than said second voltage, said second voltage follows said first voltage again.

It is preferable that said transistor is a p-channel FET; said first voltage is applied to the non-inverting input terminal of said operational amplifier; the inverting input terminal of said operational amplifier is connected to the feedback network; the output terminal of said operational amplifier is connected to the gate of said p-channel FET.

It is preferable that the drain of said p-channel FET is connected to the lowest voltage terminal of the circuit and the source is connected to said resistor; the other terminal of said resistor is connected to said capacitor; and a low noise direct current (DC) voltage of the circuit is applied to the other terminal of said capacitor.

It is preferable that before the measurement, said second voltage is set to be higher than the highest voltage in the effective measuring range.

It is preferable that when said first voltage is lower than said second voltage, the logic state of the output of said operational amplifier is "low". In the meantime, said p-channel FET is turned on and said second voltage follows said first voltage.

It is preferable that when said first voltage is higher than said second voltage, the logic state of the output of said operational amplifier is "high". In the meantime, said p-channel FET is off and said capacitor maintains the voltage of said second voltage.

It is preferable that once said first voltage decreases to be lower than said second voltage, said second voltage follows said first voltage again.

It is preferable that said transistor is a p-channel FET; said first voltage is applied to the inverting input terminal of said operational amplifier; the non-inverting input terminal of said operational amplifier is connected to the feedback network; the output terminal of said operational amplifier is connected to the gate of said p-channel FET.

It is preferable that the source of said p-channel FET is connected to the highest voltage terminal of the circuit and the drain is connected to said resistor; the other terminal of said resistor is connected to said capacitor; and a low noise direct current (DC) voltage of the circuit is applied to the other terminal of said capacitor.

It is preferable that before the measurement, said second voltage is set to be lower than the lowest voltage in the effective measuring range.

It is preferable that when said first voltage is higher than said second voltage, the logic state of the output of said operational amplifier is "low". In the meantime, said p-channel FET is turned on and said second voltage immediately follows said first voltage.

It is preferable that when said first voltage is lower than said second voltage, the logic state of the output of said operational amplifier is "high". In the meantime, said p-channel FET is off and said capacitor maintains the voltage of said second voltage.

It is preferable that once said first voltage increases to be higher than said second voltage, said second voltage follows said first voltage again.

It is preferable that said transistor is an n-channel FET; said first voltage is applied to the inverting input terminal of said operational amplifier; the non-inverting input terminal of said operational amplifier is connected to the feedback network; the output terminal of said operational amplifier is connected to the gate of said n-channel FET.

It is preferable that the source of said n-channel FET is connected to the lowest voltage terminal of the circuit and the drain is connected to said resistor; the other terminal of said resistor is connected to said capacitor; and a low noise direct current (DC) voltage of the circuit is applied to the other terminal of said capacitor.

It is preferable that before the measurement, said second voltage is set to be higher than the highest voltage in the effective measuring range.

It is preferable that the substrate of said n-channel FET is connected to the lowest voltage terminal of the circuit.

It is preferable that when said first voltage is lower than said second voltage, the logic state of the output of said operational amplifier is "high". In the meantime, said n-channel FET is turned on and said second voltage immediately follows said first voltage.

It is preferable that when said first voltage is higher than said second voltage, the logic state of the output of said operational amplifier is "low". In the meantime, said n-channel FET is off and said capacitor maintains the voltage of said second voltage.

It is preferable that once said first voltage decreases to be lower than said second voltage, said second voltage follows said first voltage again.

The present invention further provides a peak hold and calibration circuit for use in measuring the signals in a digital multi-meter, which can be implemented by using an integrated circuit (IC) and a capacitor, wherein said IC is connected to said capacitor; wherein said IC comprises an operational amplifier, a transistor, and a resistor; wherein a low noise direct current (DC) voltage of the circuit is applied to the inverting input terminal of said operational amplifier and the non-inverting input terminal of said operational amplifier is connected to the feedback network while the output terminal of said operational amplifier is connected to the gate of said transistor, which can provide a current that is large enough to charge said capacitor; wherein said resistor is connected to said transistor and said capacitor at the both terminals so as to prevent said second voltage from overshooting.

It is preferable that said transistor is a p-channel FET, the source of which is connected to the highest voltage terminal of the circuit; the drain of which is connected to one terminal of said resistor and the other terminal of said resistor is connected to said capacitor, to which a low noise direct current (DC) voltage of the circuit is applied.

It is preferable that a low noise direct current (DC) voltage (GND) of the circuit is applied to the inverting input terminal of said operational amplifier and the non-inverting input terminal of said operational amplifier is connected to the feedback network, therefore the output voltage is the input offset voltage of said operational amplifier.

It is preferable that said transistor is an n-channel FET, the source of which is connected to the lowest voltage terminal of the circuit; the drain of which is connected to one terminal of said resistor and the other terminal of said resistor is connected to said capacitor, to which a low noise direct current (DC) voltage of the circuit is applied.

It is preferable that the substrate of said n-channel FET is connected to the lowest voltage terminal of the circuit.

It is preferable that a low noise direct current (DC) voltage (GND) of the circuit is applied to the inverting input terminal of said operational amplifier and the non-inverting input terminal of said operational amplifier is connected to the feedback network, therefore the output voltage is the input offset voltage of said operational amplifier.

BRIEF DESCRIPTION OF THE DRAWINGS

The object, spirit and advantages of the preferred embodiments of the present invention will be readily understood by the accompanying drawings and detailed descriptions.

DETAILED DESCRIPTION OF THE INVENTION

The present invention provides a peak hold and calibration circuit for use in measuring the signals in a digital multi-meter, which can be implemented by using an integrated circuit (to be abbreviated as "IC" here below) and a capacitor, wherein said IC is connected to said capacitor; wherein said IC comprises an operational amplifier, and a switching circuit; wherein a first voltage is applied to the non-inverting input terminal of said operational amplifier and the inverting input terminal of said operational amplifier is connected to the feedback network while the output terminal of said operational amplifier is connected to said switching circuit; wherein the output of said switching circuit is a second voltage and connected to said capacitor.

The peak hold and calibration circuit for use in measuring the signals in a digital multi-meter of the present utilizes only a few components, thus it has lower fabricating cost, higher economic profit and lower power consumption can solve the problems in that the diode which has short switching time, small parasitic capacitance, and small leakage current is hardly found.

Hereinafter, the preferred embodiments of a peak hold and calibration circuit for use in measuring the signals in a digital multi-meter of the present invention will be described in detail with reference to the accompanying drawings.

Figure 3A:
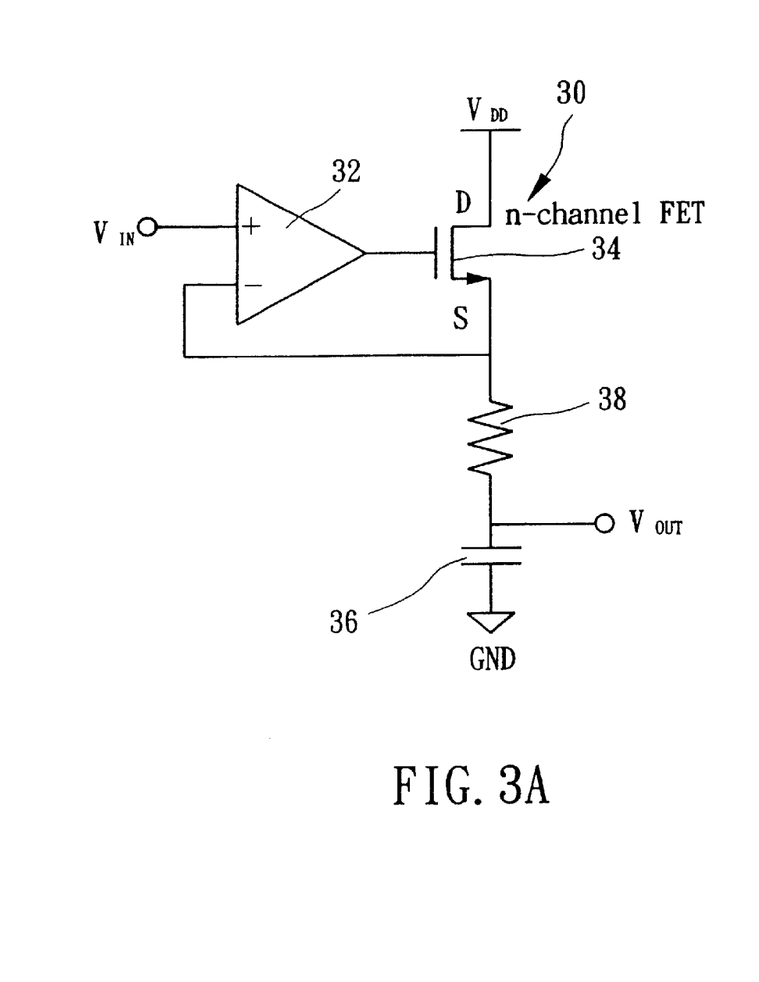
FIG. 3A is a detailed circuit that illustrates the peak maximum circuit of the peak hold circuit in the digital multi-meter in accordance with the first embodiment of the present invention.
Figure 3B:
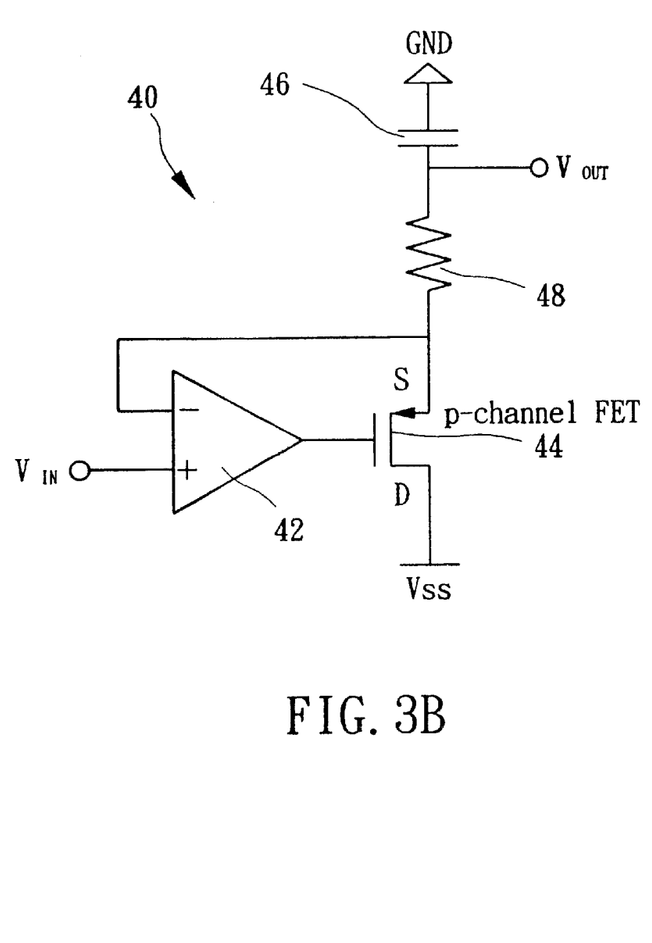
FIG. 3B is a detailed circuit that illustrates the peak minimum circuit of the peak hold circuit in the digital multi-meter in accordance with the first embodiment of the present invention.

To begin with, please refer to FIG. 3A and FIG. 3B, which illustrate the peak hold and calibration circuit for use in measuring the signals in a digital multi-meter in accordance with the first embodiment of the present invention. The peak hold circuit is implemented by using very large scale integration (VLSI) technology and an externally connected capacitor. To be more specific, FIG. 3A is a peak maximum circuit 30, and FIG. 3B is a peak minimum circuit 40.

As shown in FIG. 3A, said peak maximum circuit 30 is implemented by using an integrated circuit (IC) and a capacitor 36, wherein said IC is connected to said capacitor 36; wherein said IC comprises an operational amplifier 32, an n-channel FET 34, and a resistor 38; wherein an input voltage $V_{IN}$ is directly applied to the non-inverting input terminal of said operational amplifier 32 and the inverting input terminal of said operational amplifier 32 is connected to the feedback network while the output terminal of said operational amplifier 32 is connected to the gate of said n-channel FET 34.

The drain of said n-channel FET 34 is connected to a high voltage source $V_{DD}$, which is the highest voltage of the circuit; the source of said n-channel FET 34 is connected to one terminal of said resistor 38, and the other terminal of said resistor 38 is connected to said capacitor 36, to which GND, a low noise direct current (DC) voltage of the circuit is applied.

Said resistor 38 is connected to said n-channel FET 34 and said capacitor 36 at the both terminals so as to prevent the output voltage $V_{OUT}$ from overshooting. Before the measurement of the peak maximum, the output voltage $V_{OUT}$ is set to be lower than the lowest voltage in the effective measuring range.

When the input voltage $V_{IN}$ is higher than the output voltage $V_{OUT}$, the logic state of the output of said operational amplifier 32 is "high". In the meantime, said n-channel FET 34 is turned on and the output voltage $V_{OUT}$ follows the input voltage $V_{IN}$. In this case, the output voltage $V_{OUT}$ equals to the input voltage $V_{IN}$.

On the contrary, when the input voltage $V_{IN}$ is lower than the output voltage $V_{OUT}$, the logic state of the output of said operational amplifier 32 is "low". In the meantime, said n-channel FET 34 is off and said capacitor 36 maintains the voltage of the output voltage $V_{OUT}$. Once the input voltage $V_{IN}$ increases to be higher than the output voltage $V_{OUT}$, the output voltage $V_{OUT}$ follows the input voltage $V_{IN}$ again.

As can be seen in FIG. 3B, said peak minimum circuit 40 is implemented by using an integrated circuit (IC) and a capacitor 46, wherein said IC is connected to said capacitor 46; wherein said IC comprises an operational amplifier 42, a p-channel FET 44, and a resistor 48; wherein an input voltage $V_{IN}$ is directly applied to the non-inverting input terminal of said operational amplifier 42 and the inverting input terminal of said operational amplifier 42 is connected to the feedback network while the output terminal of said operational amplifier 42 is connected to the gate of said p-channel FET 44.

The drain of said p-channel FET 44 is connected to a low voltage source $V_{SS}$, which is the lowest voltage of the circuit; the source of said p-channel FET 44 is connected to one terminal of said resistor 48, and the other terminal of said resistor 48 is connected to said capacitor 46, to which GND, a low noise direct current (DC) voltage of the circuit is applied.

Said resistor 48 is connected to said p-channel FET 44 and said capacitor 46 at the both terminals so as to prevent the output voltage $V_{OUT}$ from overshooting. Before the measurement of the peak minimum, the output voltage $V_{OUT}$ is set to be higher than the highest voltage in the effective measuring range.

When the input voltage $V_{IN}$ is lower than the output voltage $V_{OUT}$, the logic state of the output of said operational amplifier 42 is "low". In the meantime, said p-channel FET 44 is turned on and the output voltage $V_{OUT}$ follows the input voltage $V_{IN}$. In this case, the output voltage $V_{OUT}$ equals to the input voltage $V_{IN}$.

On the contrary, when the input voltage $V_{IN}$ is higher than the output voltage $V_{OUT}$, the logic state of the output of said operational amplifier 42 is "high". In the meantime, said p-channel FET 44 is off and said capacitor 46 maintains the voltage of the output voltage $V_{OUT}$. Once the input voltage $V_{IN}$ decreases to be lower than the output voltage $V_{OUT}$, the output voltage $V_{OUT}$ follows the input voltage $V_{IN}$ again.

Figure 4A:
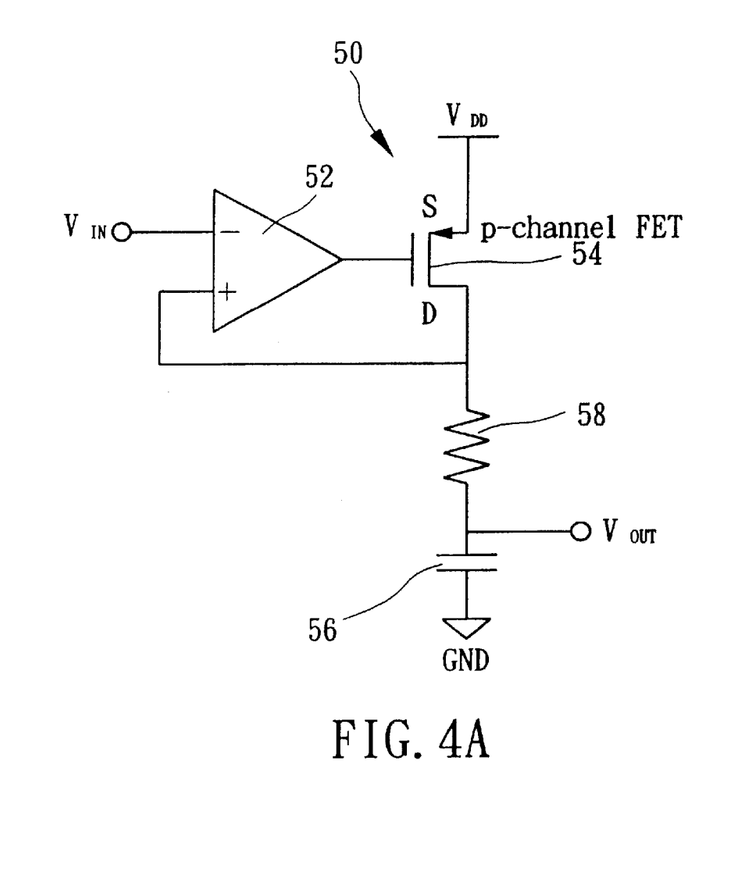
FIG. 4A is a detailed circuit that illustrates the peak maximum circuit of the peak hold circuit in the digital multi-meter in accordance with the second embodiment of the present invention.
Figure 4B:
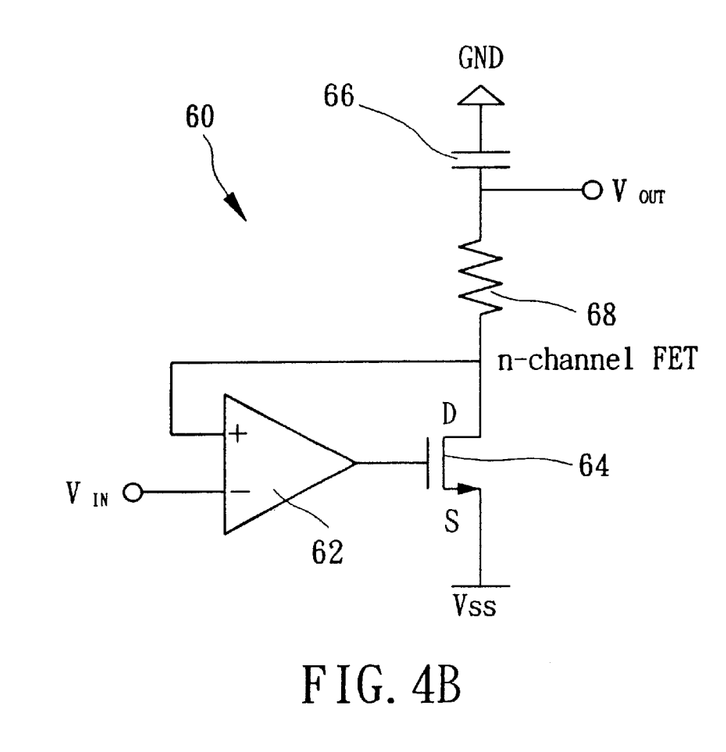
FIG. 4B is a detailed circuit that illustrates the peak minimum circuit of the peak hold circuit in the digital multi-meter in accordance with the second embodiment of the present invention.

Secondly, please refer to FIG. 4A and FIG. 4B, which illustrate the peak hold and calibration circuit for use in measuring the signals in a digital multi-meter in accordance with the second embodiment of the present invention. The peak hold circuit is implemented by using very large scale integration (VLSI) technology and an externally connected capacitor. To be more specific, FIG. 4A is a peak maximum circuit 50, and FIG. 4B is a peak minimum circuit 60.

As can be seen in FIG. 4A, said peak maximum circuit 50 is implemented by using an integrated circuit (IC) and a capacitor 56, wherein said IC is connected to said capacitor 56; wherein said IC comprises an operational amplifier 52, a p-channel FET 54, and a resistor 58; wherein an input voltage $V_{IN}$ is directly applied to the inverting input terminal of said operational amplifier 52 and the non-inverting input terminal of said operational amplifier 52 is connected to the feedback network while the output terminal of said operational amplifier 52 is connected to the gate of said p-channel FET 54.

The source of said p-channel FET 54 is connected to a high voltage source $V_{DD}$, which is the highest voltage of the circuit; the drain of said p-channel FET 54 is connected to one terminal of said resistor 58, and the other terminal of said resistor 58 is connected to said capacitor 56, to which GND, a low noise direct current (DC) voltage of the circuit is applied.

Said resistor 58 is connected to said p-channel FET 54 and said capacitor 56 at the both terminals so as to prevent the output voltage $V_{OUT}$ from overshooting. Before the measurement of the peak maximum, the output voltage $V_{OUT}$ is set to be lower than the lowest voltage in the effective measuring range.

When the input voltage $V_{IN}$ is higher than the output voltage $V_{OUT}$, the logic state of the output of said operational amplifier 52 is "low". In the meantime, said p-channel FET 54 is turned on and $V_{gs}$ equals to ($V_{DD}-V_{SS}$). Since said p-channel FET 54 is free from the body effect, it can provide a current that is large enough to charge said capacitor 56. Therefore, the output voltage $V_{OUT}$ immediately follows the input voltage $V_{IN}$. In this case, the output voltage $V_{OUT}$ equals to the input voltage $V_{IN}$.

On the contrary, when the input voltage $V_{IN}$ is lower than the output voltage $V_{OUT}$, the logic state of the output of said operational amplifier 52 is "high". In the meantime, said p-channel FET 54 is off and said capacitor 56 maintains the voltage of the output voltage $V_{OUT}$. Once the input voltage $V_{IN}$ increases to be higher than the output voltage $V_{OUT}$, the output voltage $V_{OUT}$ follows the input voltage $V_{IN}$ again.

Since said peak maximum circuit 50 of the second embodiment utilizes a p-channel FET as shown in FIG. 4A, it has a larger output swing than said peak maximum circuit 30 of the first embodiment that utilizes an n-channel FET as shown in FIG. 3A.

As shown in FIG. 4B, said peak minimum circuit 60 is implemented by using an integrated circuit (IC) and a capacitor 66, wherein said IC is connected to said capacitor 66; wherein said IC comprises an operational amplifier 62, an n-channel FET 64, and a resistor 68; wherein an input voltage $V_{IN}$ is directly applied to the inverting input terminal of said operational amplifier 62 and the non-inverting input terminal of said operational amplifier 62 is connected to the feedback network while the output terminal of said operational amplifier 62 is connected to the gate of said n-channel FET 64.

The source of said n-channel FET 64 is connected to a low voltage source $V_{SS}$, which is the lowest voltage of the circuit; the drain of said n-channel FET 64 is connected to one terminal of said resistor 68, and the other terminal of said resistor 68 is connected to said capacitor 66, to which GND, a low noise direct current (DC) voltage of the circuit is applied.

Said resistor 68 is connected to said n-channel FET 64 and said capacitor 66 at the both terminals so as to prevent the output voltage $V_{OUT}$ from overshooting. Before the measurement of the peak maximum, the output voltage $V_{OUT}$ is set to be higher than the highest voltage in the effective measuring range.

When the input voltage $V_{IN}$ is lower than the output voltage $V_{OUT}$, the logic state of the output of said operational amplifier 62 is "high". In the meantime, said n-channel FET 64 is turned on. Since the substrate of said n-channel FET 64 is also connected to the low voltage source $V_{SS}$, which is the lowest voltage of the circuit, said n-channel FET 64 is free from the body effect, and can provide a current that is large enough to charge said capacitor 66. Therefore, the output voltage $V_{OUT}$ immediately follows the input voltage $V_{IN}$. In this case, the output voltage $V_{OUT}$ equals to the input voltage $V_{IN}$.

On the contrary, when the input voltage $V_{IN}$ is higher than the output voltage $V_{OUT}$, the logic state of the output of said operational amplifier 62 is "low". In the meantime, said n-channel FET 64 is off and said capacitor 66 maintains the voltage of the output voltage $V_{OUT}$. Once the input voltage $V_{IN}$ decreases to be lower than the output voltage $V_{OUT}$, the output voltage $V_{OUT}$ follows the input voltage $V_{IN}$ again.

Since said peak minimum circuit 60 of the second embodiment utilizes an n-channel FET 64 as shown in FIG. 4B, it has a smaller output swing than said peak minimum circuit 40 of the first embodiment that utilizes a p-channel FET 44 as shown in FIG. 3B.

It is notable that in accordance with the second embodiment of the present invention, the peak maximum circuit 50 utilizes a p-channel FET 54 instead of an n-channel FET so as to avoid the problems that when the output voltage is high, $V_{gs}$ (equals to $V_{DD}-V_{OUT}$) can be too low to provide a current that is large enough to charge the capacitor 56 and that the threshold voltage $V_t$ increases to affect the device operation due to the body effect of an n-channel FET.

Due to the body effect of an n-channel FET, when the voltage from the voltage source decreases, the n-channel FET can not provide a current that is large enough to charge the capacitor and consequently the output voltage $V_{OUT}$ can not follow the input voltage $V_{IN}$ immediately.

Let us consider the situation in which the peak maximum circuit 50 utilizes an n-channel FET. When the voltage from the voltage source decreases, the $(V_{gs}-V_t)$ value becomes too small and can not provide a current that is large enough to charge the capacitor as the input voltage $V_{IN}$ reaches the maximum. In this case, the output voltage $V_{OUT}$ can not follow the input voltage $V_{IN}$. Consequently, the output voltage $V_{OUT}$ is not equal to the input voltage $V_{IN}$. To be more precise, the output voltage $V_{OUT}$ is lower than the input voltage $V_{IN}$. Then, as the input voltage $V_{IN}$ decreases to be lower than the output voltage $V_{OUT}$, the output voltage $V_{OUT}$ is maintained unchanged and finally becomes lower than the maximum of the input voltage $V_{IN}$.

It is also notable that even though said peak minimum circuit 40 of the first embodiment utilizes a p-channel FET 44 as shown in FIG. 3B is free from the body effect, said p-channel FET 44 may also fail to provide a current that is large enough to charge said capacitor 46 when the voltage from the voltage source decreases. Consequently, the output voltage $V_{OUT}$ is not equal to the input voltage $V_{IN}$. To be more precise, the output voltage $V_{OUT}$ is lower than the input voltage $V_{IN}$.

Figure 5A:
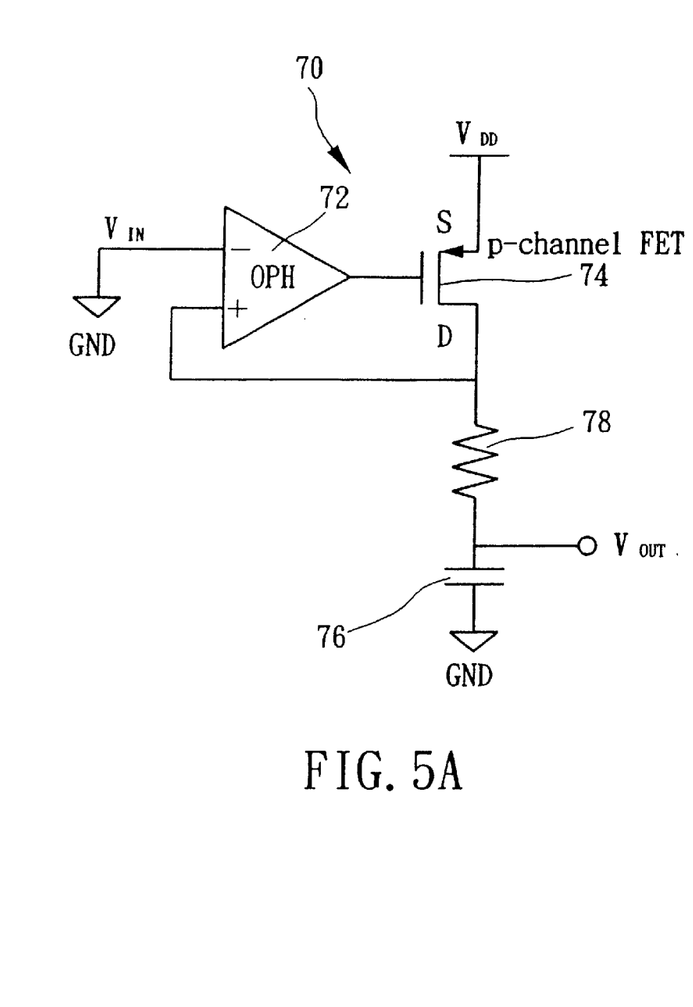
FIG. 5A is a detailed circuit that illustrates the peak maximum circuit of the peak hold and calibration circuit in the digital multi-meter in accordance with the third embodiment of the present invention.
Figure 5B:
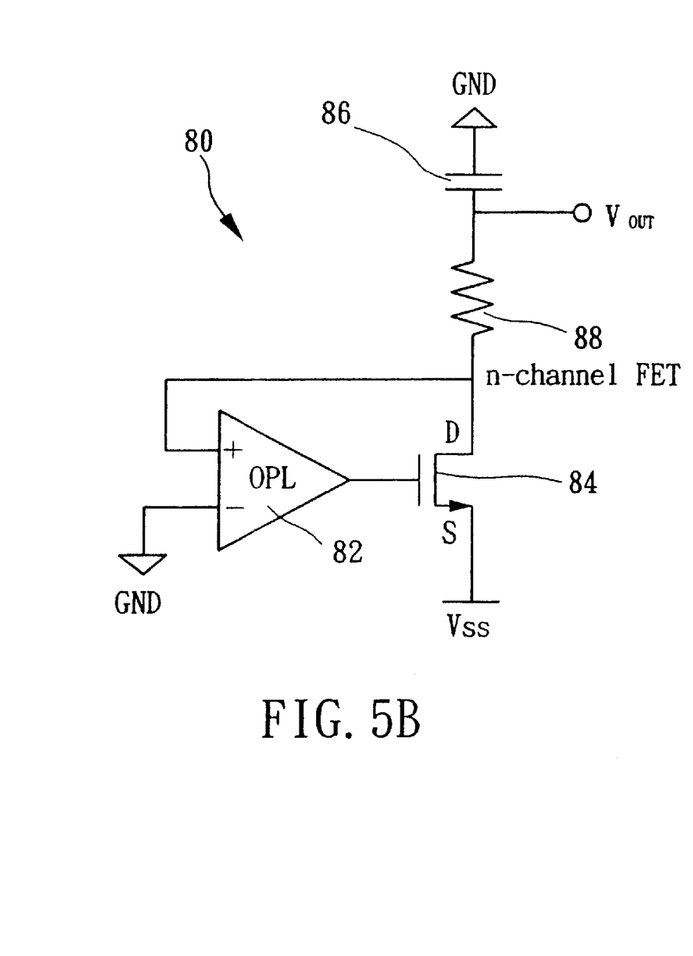
FIG. 5B is a detailed circuit that illustrates the peak minimum circuit of the peak hold and calibration circuit in the digital multi-meter in accordance with the third embodiment of the present invention.

Thirdly, please further refer to FIG. 5A and FIG. 5B, which illustrate the peak hold and calibration circuit for use in measuring the signals in a digital multi-meter in accordance with the third embodiment of the present invention. To be more specific, FIG. 5A is a peak maximum circuit 70, and FIG. 5B is a peak minimum circuit 80.

Since an operational amplifier usually has an input offset voltage of tens of milli-volts that leads to the error of the measurement, before the measurement of the peak maximum or minimum by using a peak hold and calibration circuit in a digital multi-meter, the system must be calibrated in advance.

In a dual slope analog/digital converter, assuming each count indicates 0.1 mV, 10 mV can be replaced by 100 counts. The third embodiment of the present invention utilizes the calibration method to compensate for the error resulted from the offset voltage of the peak hold circuit, including the input offset voltage of the operational amplifier.

Since said peak maximum circuit 70 utilizes an operational amplifier OPH 72 and said peak minimum circuit 80 utilizes an operational amplifier OPL 82, said operational amplifiers OPH 72 and OPL 82 need to be calibrated respectively. When the peak maximum is measured, the result should subtract the offset voltage of said operational amplifier OPH 72; when the peak minimum is measured, the result should subtract the offset voltage of said operational amplifier OPL 82.

As can be seen in FIG. 5A, said peak maximum circuit 70 is implemented by using an integrated circuit (IC) and a capacitor 76, wherein said IC is connected to said capacitor 76; wherein said IC comprises an operational amplifier 72, a p-channel FET 74, and a resistor 78; wherein an input voltage $V_{IN}$ is directly applied to the inverting input terminal of said operational amplifier 72 and the non-inverting input terminal of said operational amplifier 72 is connected to the feedback network while the output terminal of said operational amplifier 72 is connected to the gate of said p-channel FET 74.

The source of said p-channel FET 74 is connected to a high voltage source $V_{DD}$, which is the highest voltage of the circuit; the drain of said p-channel FET 74 is connected to one terminal of said resistor 78, and the other terminal of said resistor 78 is connected to said capacitor 76, to which GND, a low noise direct current (DC) voltage of the circuit is applied.

Before calibration, the output voltage $V_{OUT}$ of said peak maximum circuit 70 must be set to be lower than the offset voltage. During calibration, the input terminal must be connected to GND. After the output voltage becomes stable, the output voltage $V_{OUT}$ is the input offset voltage of said operational amplifier 72.

Then, the dual slope analog/digital converter into a digital signal that is later loaded into the digital circuit converts the input offset voltage of said operational amplifier 72. Later, the digital circuit subtracts the offset voltage from the result of peak measurement.

As shown in FIG. 5B, said peak minimum circuit 80 is implemented by using an integrated circuit (IC) and a capacitor 86, wherein said IC is connected to said capacitor 86; wherein said IC comprises an operational amplifier 82, an n-channel FET 84, and a resistor 78; wherein an input voltage $V_{IN}$ is directly applied to the inverting input terminal of said operational amplifier 82 and the non-inverting input terminal of said operational amplifier 82 is connected to the feedback network while the output terminal of said operational amplifier 82 is connected to the gate of said n-channel FET 84.

The source of said n-channel FET 84 is connected to a low voltage source $V_{SS}$, which is the lowest voltage of the circuit; the drain of said n-channel FET 84 is connected to one terminal of said resistor 88, and the other terminal of said resistor 88 is connected to said capacitor 86, to which GND, a low noise direct current (DC) voltage of the circuit is applied.

Before calibration, the output voltage $V_{OUT}$ of said peak minimum circuit 80 must be set to be higher than the offset voltage. During calibration, the input terminal must be connected to GND. After the output voltage becomes stable, the output voltage $V_{OUT}$ is the input offset voltage of said operational amplifier 82.

Then, the dual slope analog/digital converter into a digital signal that is later loaded into the digital circuit converts the input offset voltage of said operational amplifier 82. Later, the digital circuit subtracts the offset voltage from the result of peak measurement.

Figure 6:
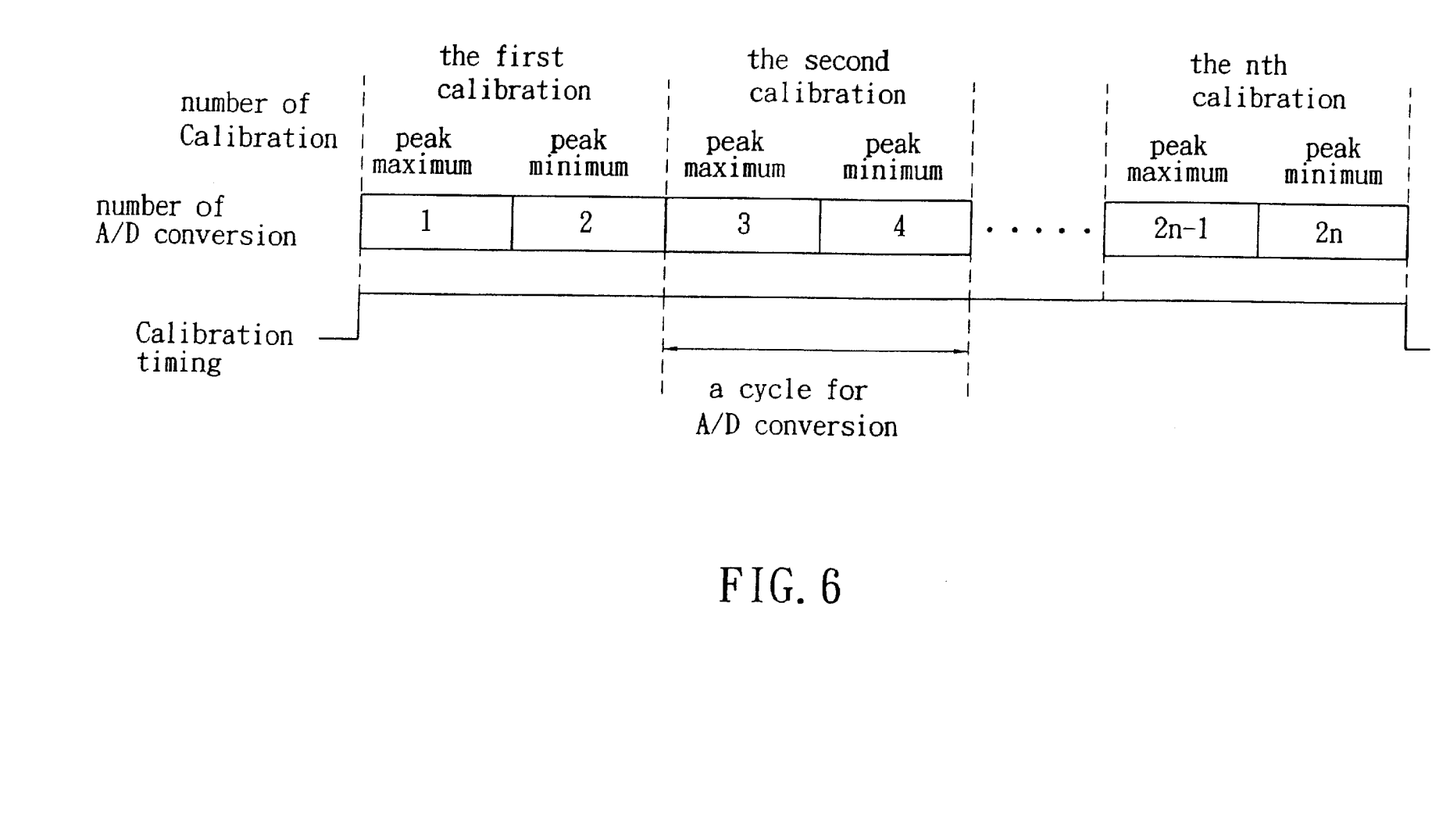
FIG. 6 is a somewhat schematic diagram that illustrates the calibration timing that is applied to the peak hold and calibration circuit in the digital multi-meter in accordance with the third embodiment of the present invention.

Please further refer to FIG. 6, which is a somewhat schematic diagram that illustrates the calibration timing that is applied to the peak hold and calibration circuit in the digital multi-meter in accordance with the third embodiment of the present invention. During calibration, the dual slope analog/digital converter alternately calculates the peak maxima from said maximum circuit 70 (as shown in FIG. 5A) and the peak minima from said minimum circuit 80 (as shown in FIG. 5B) for n times until the nth calibration is completed.

The number of calculation depends on the time required for circuit stability. The result of the last calculation is converted into a digital signal and loaded in a register of the digital circuit. When the peak maximum is measured, the digital circuit subtracts the offset voltage of said operational amplifier 72; when the peak minimum is measured; the digital circuit subtracts the offset voltage of said operational amplifier 82.

The present invention can easily realize calibration by using VLSI design and further avoid the problems of the conventional peak hold circuit in that the peak hold circuit has higher fabricating cost, less economic profit and the diode is hardly found and has lower switching speed and higher power consumption.

Consequently, in the present invention, the proposed peak hold and calibration circuit for use in measuring the signals in a digital multi-meter utilizes simple VLSI design so as to reduce the fabricating cost, improve the economic profit and has advantages over the conventional peak hold circuits of the prior arts in higher speed, higher gain and less power consumption.

As discussed so far, the conventional peak hold circuits of the prior arts have problems in that the peak hold circuit has higher fabricating cost, less economic profit, high power-consumption and the diode is hardly found and has lower switching speed and; on the contrary, the present invention has proposed a solution to the problems by using VLSI technology. Consequently, the present invention has been examined to be progressive and has great potential in commercial applications.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A peak and hold calibration circuit for use in measuring the signals in a digital multi-meter, which can be implemented by using an integrated circuit (IC) and a capacitor, wherein said IC is connected to said capacitor;

wherein said IC comprises an operational amplifier, and a switching circuit;

wherein a first voltage is applied to one input terminal of said operational amplifier and the other input terminal of said operational amplifier is connected to a feedback network while the output terminal of said operational amplifier is connected to said switching circuit;

wherein the output of said switching circuit is a second voltage and connected to said capacitor via a resistor; and wherein said capacitor is connected between said resistor and ground.

2. The peak hold and calibration circuit for use in measuring the signals in a digital multi-meter as recited in claim 1, wherein said switching circuit comprises a transistor, which can provide a current that is large enough to charge said capacitor.

3. The peak hold and calibration circuit for use in measuring the signals in a digital multi-meter as recited in claim 1, wherein the peak hold and calibration circuit further comprises a resistor, which is connected to said transistor so as to prevent said second voltage from overshooting.

4. The peak hold and calibration circuit for use in measuring the signals in a digital multi-meter as recited in claim 2, wherein said transistor is an n-channel field effect transistor (FET); said first voltage is applied to the non-inverting input terminal of said operational amplifier; the inverting input terminal of said operational amplifier is connected to the feedback network; the output terminal of said operational amplifier is connected to the gate of said n-channel FET.

5. The peak hold and calibration circuit for use in measuring the signals in a digital multi-meter as recited in claim 4, wherein the drain of said n-channel FET is connected to the highest voltage terminal of the circuit and the source is connected to said resistor; the other terminal of said resistor is connected to said capacitor; and a low noise direct current (DC) voltage of the circuit is applied to the other terminal of said capacitor.

6. The peak hold and calibration circuit for use in measuring the signals in a digital multi-meter as recited in claim 5, wherein before the measurement, said second voltage is set to be lower than the lowest voltage in the effective measuring range.

7. The peak hold and calibration circuit for use in measuring the signals in a digital multi-meter as recited in claim 6, wherein when said first voltage is higher than said second voltage, the logic state of the output of said operational amplifier is "high", said n-channel FET is turned on and said second voltage follows said first voltage.

8. The peak hold and calibration circuit for use in measuring the signals in a digital multi-meter as recited in claim 6, wherein when said first voltage is lower than said second voltage, the logic state of the output of said operational amplifier is "low", said n-channel FET is off and said capacitor maintains the voltage of said second voltage.

9. The peak hold and calibration circuit for use in measuring the signals in a digital multi-meter as recited in claim 8, wherein once said first voltage increases to be higher than said second voltage, said second voltage follows said first voltage again.

10. The peak hold and calibration circuit for use in measuring the signals in a digital multi-meter as recited claim 2, wherein said transistor is a p-channel FET; said first voltage is applied to the non-inverting input terminal of said operational amplifier; the inverting input terminal of said operational amplifier is connected to the feedback network; the output terminal of said operational amplifier is connected to the gate of said p-channel FET.

11. The peak hold and calibration circuit for use in measuring the signals in a digital multi-meter as recited in claim 10, wherein the drain of said p-channel FET is connected to the lowest voltage terminal of the circuit and the source is connected to said resistor; the other terminal of said resistor is connected to said capacitor; and a low noise direct current (DC) voltage of the circuit is applied to the other terminal of said capacitor.

12. The peak hold and calibration circuit for use in measuring the signals in a digital multi-meter as recited in claim 11, wherein before the measurement, said second voltage is set to be higher than the highest voltage in the effective measuring range.

13. The peak hold and calibration circuit for use in measuring the signals in a digital multi-meter as recited in claim 12, wherein when said first voltage is lower than said second voltage, the logic state of the output of said operational amplifier is "low", said p-channel FET is turned on and said second voltage follows said first voltage.

14. The peak hold and calibration circuit for use in measuring the signals in a digital multi-meter as recited in claim 12, wherein when said first voltage is higher than said second voltage, the logic state of the output of said operational amplifier is "high", said p-channel FET is off and said capacitor maintains the voltage of said second voltage.

15. The peak hold and calibration circuit for use in measuring the signals in a digital multi-meter as recited in claim 14, wherein once said first voltage decreases to be lower than said second voltage, said second voltage follows said first voltage again.

16. The peak hold and calibration circuit for use in measuring the signals in a digital multi-meter as recited claim 2, wherein said transistor is a p-channel FET; said first voltage is applied to the inverting input terminal of said operational amplifier; the non-inverting input terminal of said operational amplifier is connected to the feedback network; the output terminal of said operational amplifier is connected to the gate of said p-channel FET.

17. The peak hold and calibration circuit for use in measuring the signals in a digital multi-meter as recited in claim 16, wherein the source of said p-channel FET is connected to the highest voltage terminal of the circuit and the drain is connected to said resistor; the other terminal of said resistor is connected to said capacitor; and a low noise direct current (DC) voltage of the circuit is applied to the other terminal of said capacitor.

18. The peak hold and calibration circuit for use in measuring the signals in a digital multi-meter as recited in claim 17, wherein before the measurement, said second voltage is set to be lower than the lowest voltage in the effective measuring range.

19. The peak hold and calibration circuit for use in measuring the signals in a digital multi-meter as recited in claim 18, wherein when said first voltage is higher than said second voltage, the logic state of the output of said operational amplifier is "low", said p-channel FET is turned on and said second voltage immediately follows said first voltage.

20. The peak hold and calibration circuit for use in measuring the signals in a digital multi-meter as recited in claim 18, wherein when said first voltage is lower than said second voltage, the logic state of the output of said operational amplifier is "high", said p-channel FET is off and said capacitor maintains the voltage of said second voltage.

21. The peak hold and calibration circuit for use in measuring the signals in a digital multi-meter as recited in claim 20, wherein once said first voltage increases to be higher than said second voltage, said second voltage follows said first voltage again.

22. The peak hold and calibration circuit for use in measuring the signals in a digital multi-meter as recited claim 2, wherein said transistor is an n-channel FET; said first voltage is applied to the inverting input terminal of said operational amplifier; the non-inverting input terminal of said operational amplifier is connected to the feedback network; the output terminal of said operational amplifier is connected to the gate of said n-channel FET.

23. The peak hold and calibration circuit for use in measuring the signals in a digital multi-meter as recited in claim 22, wherein the source of said n-channel FET is connected to the lowest voltage terminal of the circuit and the drain is connected to said resistor; the other terminal of said resistor is connected to said capacitor; and a low noise direct current (DC) voltage of the circuit is applied to the other terminal of said capacitor.

24. The peak hold and calibration circuit for use in measuring the signals in a digital multi-meter as recited in claim 22, wherein before the measurement, said second voltage is set to be higher than the highest voltage in the effective measuring range.

25. The peak hold and calibration circuit for use in measuring the signals in a digital multi-meter as recited in claim 22, wherein the substrate of said n-channel FET is connected to the lowest voltage terminal of the circuit.

26. The peak hold and calibration circuit for use in measuring the signals in a digital multi-meter as recited in claim 24, wherein when said first voltage is lower than said second voltage, the logic state of the output of said operational amplifier is "high", said n-channel FET is turned on and said second voltage immediately follows said first voltage.

27. The peak hold and calibration circuit for use in measuring the signals in a digital multi-meter as recited in claim 24, wherein said first voltage is higher than said second voltage, the logic state of the output of said operational amplifier is "low", said n-channel FET is off and said capacitor maintains the voltage of said second voltage.

28. The peak hold and calibration circuit for use in measuring the signals in a digital multi-meter as recited in claim 27, wherein once said first voltage decreases to be lower than said second voltage, said second voltage follows said first voltage again.

29. A peak and hold calibration circuit for use in measuring the signals in a digital multi-meter, which can be implemented by using an integrated circuit (IC) and a capacitor,
   wherein said IC is connected to said capacitor;
   wherein said IC comprises an operational amplifier, a transistor, and a resistor;
   wherein a low noise direct current (DC) voltage of the circuit is applied to the inverting input of said operational amplifier and the non-inverting input of said operational amplifier is connected to a feedback network while the output terminal of said operational amplifier is connected to the gate of said transistor, which can provide a current that is large enough to charge said capacitor;
   wherein said resistor is connected to said transistor and said capacitor at both terminals so as to prevent said voltage from overshooting; and
   wherein said capacitor is connected between said resistor and ground.

30. The peak hold and calibration circuit for use in measuring the signals in a digital multi-meter as recited in claim 29, wherein said transistor is a p-channel FET, the source of which is connected to the highest voltage terminal of the circuit; the drain of which is connected to one terminal of said resistor and the other terminal of said resistor is connected to said capacitor, to which a low noise direct current (DC) voltage of the circuit is applied.

31. The peak hold and calibration circuit for use in measuring the signals in a digital multi-meter as recited in claim 30, wherein when said first voltage is higher than said second voltage, the logic state of the output of said operational amplifier is "low", said p-channel FET is turned on and said second voltage immediately follows said first voltage.

32. The peak hold and calibration circuit for use in measuring the signals in a digital multi-meter as recited in claim 30, wherein when said first voltage is lower than said second voltage, the logic state of the output of said operational amplifier is "high", said p-channel FET is off and said capacitor maintains the voltage of said second voltage.

33. The peak hold and calibration circuit for use in measuring the signals in a digital multi-meter as recited in claim 32, wherein once said first voltage increases to be higher than said second voltage, said second voltage follows said first voltage again.

34. The peak hold and calibration circuit for use in measuring the signals in a digital multi-meter as recited in claim 29, wherein said transistor is an n-channel channel FET, the source of which is connected to the lowest voltage terminal of the circuit; the drain of which is connected to one terminal of said resistor and the other terminal of said resistor is connected to said capacitor, to which a low noise direct current (DC) voltage of the circuit is applied.

35. The peak hold and calibration circuit for use in measuring the signals in a digital multi-meter as recited in claim 34, wherein the substrate of said n-channel FET is connected to the lowest voltage terminal of the circuit.

36. The peak hold and calibration circuit for use in measuring the signals in a digital multi-meter as recited in claim 34, wherein when said first voltage is lower than said second voltage, the logic state of the output of said operational amplifier is "high", said n-channel FET is turned on and said second voltage immediately follows said first voltage.

37. The peak hold and calibration circuit for use in measuring the signals in a digital multi-meter as recited in claim 34, wherein when said first voltage is higher than said second voltage, the logic state of the output of said operational amplifier is "low", said n-channel FET is off and said capacitor maintains the voltage of said second voltage.

38. The peak hold and calibration circuit for use in measuring the signals in a digital multi-meter as recited in claim 37, wherein once said first voltage increases to be higher than said second voltage, said second voltage follows said first voltage again.

\* \* \* \* \*